(12) United States Patent
Papandreou et al.

(10) Patent No.: US 11,188,261 B2
(45) Date of Patent: Nov. 30, 2021

(54) MEMORY CONTROLLERS FOR SOLID-STATE STORAGE DEVICES

(71) Applicant: International Business Machines Corporation, Armonk, NY (US)

(72) Inventors: Nikolaos Papandreou, Thalwil (CH); Roman Alexander Pletka, Uster (CH); Radu Ioan Stoica, Zurich (CH); Nikolas Ioannou, Zurich (CH); Sasa Tomic, Kilchberg (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 16/686,338

(22) Filed: Nov. 18, 2019

(65) Prior Publication Data

US 2021/0149592 A1     May 20, 2021

(51) Int. Cl.
  *G06F 3/06*  (2006.01)
  *G06F 13/16* (2006.01)
  *G06F 9/50*  (2006.01)

(52) U.S. Cl.
  CPC ........... *G06F 3/0659* (2013.01); *G06F 3/068* (2013.01); *G06F 3/0608* (2013.01);
  (Continued)

(58) Field of Classification Search
  None
  See application file for complete search history.

(56) References Cited

U.S. PATENT DOCUMENTS

| 7,948,798 | B1 | 5/2011 | Sheredy |
| 8,407,400 | B2 | 3/2013 | Marotta |

(Continued)

FOREIGN PATENT DOCUMENTS

| CN | 109002367 A | 12/2018 |
| WO | 2019051861 A | 3/2019 |

OTHER PUBLICATIONS

S. Hong and D. Shin, "NAND Flash-Based Disk Cache Using SLC/MLC Combined Flash Memory," 2010 International Workshop on Storage Network Architecture and Parallel I/Os, 2010, pp. 21-30 (Year: 2010).*

(Continued)

*Primary Examiner* — Edward J Dudek, Jr.
*Assistant Examiner* — Ralph A Verderamo, III
(74) *Attorney, Agent, or Firm* — Monchai Chuaychoo; Maeve M. Carpenter

(57) ABSTRACT

Aspects of the present invention disclose a method, computer program product, and system for controlling operation of an array of non-volatile memory cells comprising cells which are selectively configurable for single-bit and multibit storage. The method includes a memory controller selectively configuring the array for operation in a hybrid mode, in which the array comprises both cells configured for single-bit storage and cells configured for multibit storage, and a multibit mode in which all cells in the array are configured for multibit storage. The method further includes the memory controller dynamically switching between the hybrid and multibit mode configurations of the array corresponding to array capacity-usage traversing a defined threshold level associated with enhance endurance of the array.

14 Claims, 5 Drawing Sheets

(52) U.S. Cl.
CPC .......... *G06F 3/0611* (2013.01); *G06F 3/0653* (2013.01); *G06F 3/0679* (2013.01); *G06F 9/505* (2013.01); *G06F 9/5033* (2013.01); *G06F 13/1694* (2013.01)

(56) References Cited

U.S. PATENT DOCUMENTS

| | | |
|---|---|---|
| 2008/0172520 A1 | 7/2008 | Lee |
| 2011/0055458 A1* | 3/2011 | Kuehne ............... G06F 12/0246 711/103 |
| 2014/0313824 A1 | 10/2014 | Yoon |
| 2018/0081543 A1 | 3/2018 | Muchherla |
| 2018/0293001 A1 | 10/2018 | Muchherla |
| 2019/0019564 A1 | 1/2019 | Li |
| 2019/0034105 A1 | 1/2019 | Natarajan |
| 2019/0065080 A1 | 2/2019 | Tanpairoj |
| 2019/0080752 A1 | 3/2019 | Hwang |
| 2019/0095116 A1* | 3/2019 | Igahara ................ G06F 3/0619 |
| 2019/0155531 A1* | 5/2019 | Yang ...................... G06F 3/064 |
| 2020/0327953 A1* | 10/2020 | Fleming ............. G11C 29/4401 |

OTHER PUBLICATIONS

International Search Report dated Jan. 29, 2021 from International Application No. PCT/IB2020/060016 filed Oct. 26, 2020.
Chang, et al., "A Hybrid Approach to NAN D-Flash-Based Solid-State Disks", IEEE Trans. on Comp. 2010, Oct. 2010, pp. 1337-1349, vol. 59. <https://ieeexplore.ieee.org/stamp/stamp.jsp?tp=&arnumber=5383350>.
Im et al., "ComboFTL: Improving performance and lifespan of MLC flash memory using SLC flash buffer", Journal of Systems Architecture 56(12):641-653 • Dec. 2010.
Vatto, "Samsung SSD 850 Review", AnandTech 2014, Dec. 8, 2014, 5 pps., <https://www.anandtech.com/show/8747/samsung-ssd-850-evo-review/2>.

* cited by examiner

MEMORY CONTROLLERS FOR SOLID-STATE STORAGE DEVICES

BACKGROUND OF THE INVENTION

The present invention relates generally to memory controllers for solid-state storage devices, and more particularly to controllers for non-volatile memory arrays comprising memory cells.

Solid-state storage is non-volatile memory that uses memory cells based on electronic circuitry, typically in integrated circuits (ICs), for storing data as opposed to conventional magnetic or optical media, such as disks and tapes. Solid-state storage devices (SSDs), such as flash memory devices, are more rugged than conventional storage devices due to the absence of moving parts. SSDs offer exceptional bandwidth, significant savings in power consumption, and random I/O (input/output) performance that is orders of magnitude better than hard disk drives (HDDs).

In SSDs, the storage comprises an array of non-volatile memory cells that are organized into storage areas, or "blocks", each of which contains a set of storage locations to which data can be written. Flash memory, for example, is organized into storage blocks containing data write locations known as "pages." Each storage location comprises a set of memory cells, each of which can store a number of bits of data, and the storage may be selectively configurable for storing different numbers of bits per cell. For example, most 3D NAND flash chips support selective configuration of blocks in more than one storage mode, typically a single-bit or SLC (Single-Level Cell) storage mode in which each cell stores 1 bit, and a multibit storage mode in which each cell stores more than one bit. Current multibit flash modes include: MLC (Multi-Level Cell) mode storing 2-bits/cell; TLC (Triple-Level Cell) mode storing 3-bits/cell; and QLC (Quad-Level Cell) mode storing 4-bits/cell. SLC memory is the fastest and most durable but has the lowest capacity and highest cost, while QLC memory is cheapest but also the slowest and least durable.

Memory controllers provide dedicated control apparatus for controlling operation of non-volatile memory arrays. Memory controllers control memory configuration, data placement, address mapping, and various other operations required for internal management of memory arrays. Where the array supports different storage modes, a hybrid memory controller can split the available storage blocks into two pools operating in different modes. For example, a hybrid SLC/QLC flash controller splits the physical flash blocks into two pools, one used in SLC mode and the other in QLC mode. Benefits of hybrid controllers include improved endurance, lower read latency and lower, more predictable write latency.

SUMMARY

Aspects of the present invention disclose a method, computer program product, and system for controlling operation of an array of non-volatile memory cells comprising cells which are selectively configurable for single-bit and multibit storage. The method includes a memory controller selectively configuring the array for operation in a hybrid mode, in which the array comprises both cells configured for single-bit storage and cells configured for multibit storage, and a multibit mode in which all cells in the array are configured for multibit storage. The method further includes the memory controller dynamically switching between the hybrid and multibit mode configurations of the array corresponding to array capacity-usage traversing a defined threshold level associated with enhance endurance of the array.

DETAILED DESCRIPTION

Figure 1:
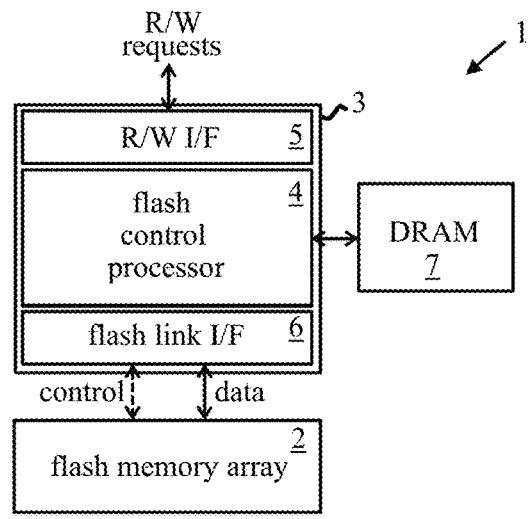
FIG. 1 is an example depiction of a schematic representation of a storage device, in accordance with an embodiment of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The block diagram of FIG. 1 depicts a general architecture of a storage device embodying the invention. In this example, the device 1 is a flash storage device having an array of flash memory cells (i.e., flash memory array 2) that are selectively configurable for single-bit and multibit storage. In an example embodiment, array 2 is a 3D NAND flash array. The device 1 includes a memory controller 3 for controlling operation of memory array 2. Memory controller 3 includes control logic. In example embodiments, memory controller 3 implements the control logic by flash control processor (FCP) 4, a read/write (R/W) interface (I/F) 5 (for servicing data read and write requests to the device), and a flash link interface 6 (for communication of data/control signals between FCP 4 and flash memory 2). Device 1 further includes volatile memory (e.g., DRAM 7) for transient storage of various metadata in operation of memory controller 3.

In general, flash memory array 2 may include one or more chips, or packages of chips, where each chip may contain one or more flash storage dies, and may provide one or more storage channels each of which may comprise one or more chips or packages. In some embodiments, flash memory array 2 may also be part of a larger storage array, providing additional flash or other storage.

In various embodiments of the present invention, read and write operations are performed on a page basis in flash memory 2, while erase operations are performed on a block basis. Data can only be written to a flash block after the flash block has been successfully erased, which can utilize a "write-out-of-place" scheme to improve write throughput and latency. With a "write-out-of-place" scheme, a stored data page is not updated in-place in the flash storage. Instead, the updated page is written to another free flash page, and the associated old flash page is marked as invalid.

Accordingly, the "write-out-of-place" scheme, as well as other flash storage characteristics, utilize certain "housekeeping" operations to be performed for internal management of flash storage. For example, as pages are updated and old pages invalidated, a "garbage collection" process is can occur to eliminate invalid data and release storage locations for new input data. The garbage collection process recovers still-valid data from an occupied flash block prior to erasure, copying valid pages to another flash block.

Garbage collection and block erasures can also be performed as part of other internal management processes which involve, in effect, moving data within the flash memory. For example, wear-leveling addresses the wear-out characteristics of flash. Flash memory has a finite number of program-erase (P/E) cycles before the storage integrity begins to deteriorate. Wear-leveling procedures aim to distribute write-erase cycles evenly among all available flash blocks, based on program-erase cycle counts, to avoid uneven wear.

In various embodiments, memory controller 3 may communicate directly with hosts to service read/write requests to device 1. In example embodiments, memory controller 3 may be managed by a higher-level controller that services host requests for a plurality of devices in a storage system. The FCP 4 can control operation of device 1 generally, managing data read and write operations in flash memory array 2 in response to requests received via R/W interface 5. FCP 4 runs an FTL (flash translation layer) software layer which maintains address metadata in DRAM 7 for data stored in the flash array. The address metadata maps logical block addresses associated with input data blocks from the host/higher-level controller to physical addresses (flash page numbers) on the flash. In example embodiments, FCP 4 may control all internal management processes in array 2, maintaining all associated metadata in DRAM 7.

In some embodiments, internal management functions may be wholly or partially controlled by local controllers on the flash chips, with FCP 4 providing high-level control. In particular, FCP 4 includes functionality for controlling configuration of flash memory array 2 (as described in detail below). FCP 4 may also implement various other processes typical in flash storage, such as error-correction coding/decoding, and heat-aware functionality to identify "hot" and "cold" data and adapt storage strategies accordingly.

In this example, the control functionality of memory controller 3 is implemented via program instructions (e.g., program modules, which are executed by FCP 4). Generally, program modules may include routines, programs, objects, components, logic, data structures, and so on that perform particular tasks or implement particular abstract data types. FCP 4 may be implemented by a processing device comprising one or more processors, and may include processor memory (comprising ROM, RAM, cache memory, etc.) storing program instructions executable by a processing device to perform the operations described, in accordance with embodiments of the present invention. FCP 4 may, for example, comprise an FPGA with an embedded CPU for executing program instructions. In other embodiments, control logic of memory controller 3 may be implemented by hardwired logic circuits. In general, however, the control logic may be implemented by hardware or software or a combination thereof, and various implementations will be apparent to those skilled in the art from the description herein.

In operation of storage device 1, the FCP 4 can selectively configure the flash memory array 2 for operation in a hybrid mode, in which the array comprises both cells configured for single-bit storage and cells configured for multibit storage, and a multibit mode in which all cells in the array are configured for multibit storage. In this example, the FCP configures flash memory array 2 for operation in a hybrid SLC/QLC mode or a QLC-only mode. In the hybrid mode, the array comprises a pool of SLC blocks, in which the memory cells are configured as SLC cells for single-bit storage, and a pool of QLC blocks in which the cells are configured as QLC cells for 4-bit storage. In the QLC-only mode, all blocks in the array are configured for QLC-storage.

Figure 2:
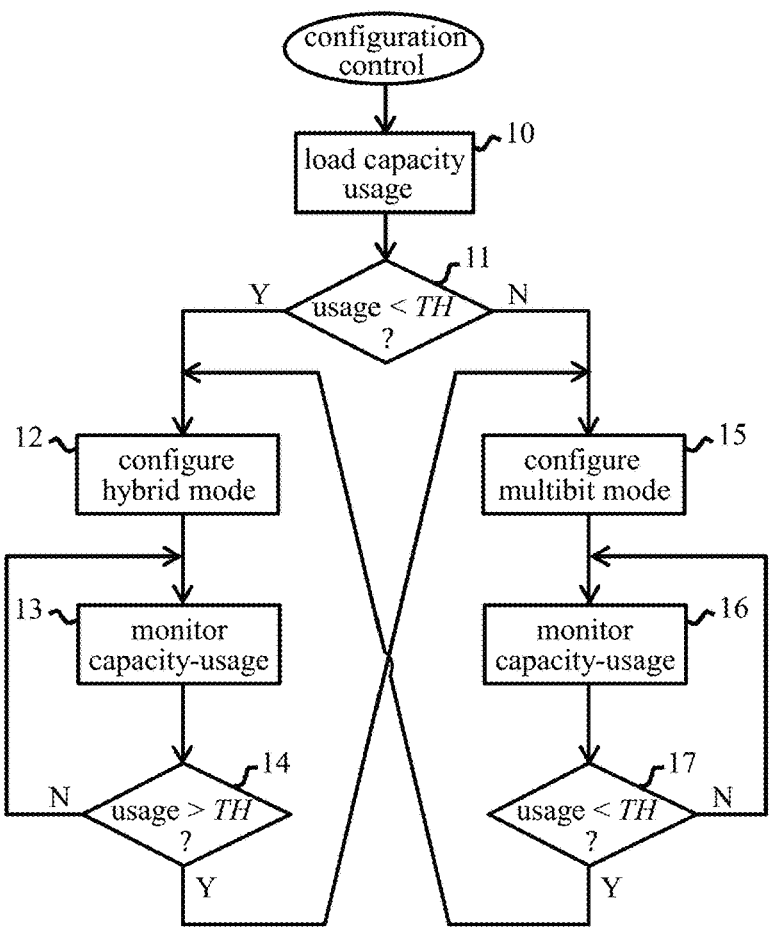
FIG. 2 is a flowchart depicting example steps of a memory control method performed by a memory controller of the FIG. 1 device, in accordance with an embodiment of the present invention.

FIG. 2 is a flowchart depicting example steps of a configuration control process. In various embodiments, FCP 4 performs the processing steps of the flowchart depicted in FIG. 2, in accordance with various embodiments of the present invention.

At runtime for device 1, FCP 4 determines the current capacity-usage for flash memory array 2 (step 10). FCP 4 can determine capacity-usage utilizing any convenient metric, such as by the number or proportion of occupied (or free) flash blocks in the array, or by the amount or proportion of valid data (e.g., valid flash pages) in the array. In the present embodiment, FCP 4 measures capacity-usage the amount of valid data as a percentage of the total array capacity in the QLC-only mode (i.e., the maximum possible array capacity). Further, FCP 4 can determine the current capacity-usage from metadata (e.g., stored in flash memory array 2 at the end of each runtime), which is loaded to DRAM 7 by FCP 4 on power-up.

In decision step 11, FCP 4 determines if the array capacity-usage is less than a threshold level TH, which is defined in FCP 4 for the array. In response to determining that the array capacity-usage is less than a threshold level TH (e.g., on first use of device 1) (decision step 11, Y branch), FCP4 configures a hybrid mode (step 12).

Figure 3:
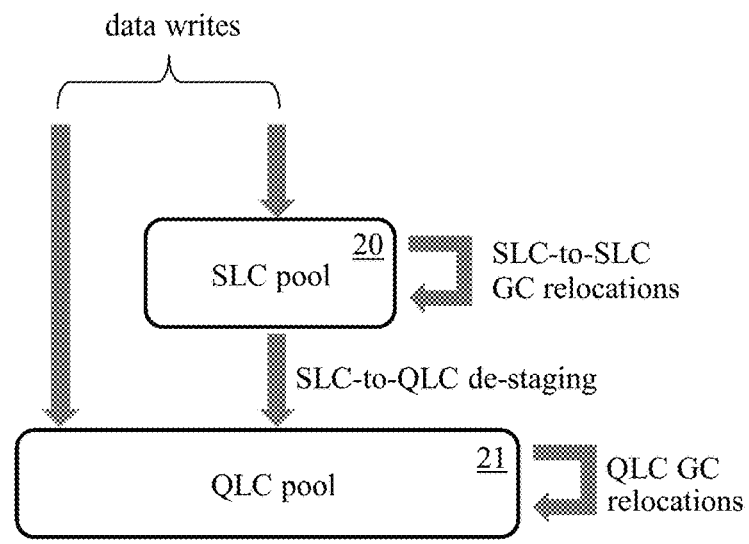
FIG. 3 is an example illustration of a hybrid mode configuration of a memory array in the FIG. 1 device, in accordance with an embodiment of the present invention.

In step 12, FCP 4 controls configuration of the array 2, via control signals over link I/F 6, for operation in the hybrid SLC/QLC mode. FIG. 3 is an example depiction of the hybrid mode of operation. Accordingly, in the hybrid mode, FCP 4 configures flash memory array 2 a pool 20 of SLC flash blocks and a pool 21 of QLC flash blocks. In an example embodiment, the ratio of SLC and QLC blocks is fixed.

During operation of the hybrid mode, FCP 4 preferentially writes data to the single-bit cells in SLC pool 20, and then moves data from the SLC pool to QLC cells in pool 21 when required to free storage capacity in the SLC pool. SLC pool 20 thus provides an initial storage tier to which data is preferably written first. In addition, when blocks in the SLC tier are exhausted, a garbage collection (GC) process "cleans" blocks in the usual manner. Valid data can be relocated in the SLC tier here or can be evicted and de-staged to the QLC tier, if necessary. In the case of high write-load to array 2, FCP 4 may also place data directly to QLC pool 21. Inside the QLC tier, a garbage collection process relocates data within that tier) i.e., no data is promoted to the SLC tier).

During operation in the hybrid mode, FCP 4 monitors capacity-usage in flash memory array 2 (step 13). In example embodiments, FCP 4 can monitor capacity-usage based on the validity flags maintained as metadata for flash pages. In decision step 14, FCP 4 determines whether capacity-usage has traversed the threshold level TH.

In response to determining that capacity-usage has not traversed the threshold level TH (decision step 14, N branch), operation of FCP 4 reverts to step 13 for continued monitoring of the hybrid mode operation. In response to determining that capacity-usage does traverse the threshold TH (decision step 14, Y branch), operation of FCP 4 proceeds to step 15 to configure the multibit mode.

In step 15, FCP 4 controls configuration of flash memory array 2 for operation in the QLC-only mode via control signals over link I/F 6. Further, returning to step 11, in response to determining that the current usage exceeds the threshold TH, at the start of any operating period (decision step 11, N branch), operation of FCP 4 proceeds in the QLC mode in step 13. In various embodiments, FCP 4 dynamically reconfigures the array. For example, FCP 4 reconfigures all flash blocks in SLC pool 20 for QLC storage. In example embodiments, FCP 4 first moves valid pages in the SLC blocks to a QLC block, and then reconfigures the freed SLC blocks for QLC storage. FCP 4 can utilize a procedure of commands/operations, typically vendor-specified for flash chips, to convert the operating mode of flash blocks from one mode to another.

In the QLC-only mode, FCP 4 monitors capacity-usage (in step 16). Further, in step 17, FCP 4 determines whether capacity-usage has dropped below the threshold TH. In response to determining that the capacity-usage has dropped below the threshold TH, operation of FCP 4 reverts to step 12 and FCP 4 dynamically reconfigures the array for hybrid mode operation. Accordingly, FCP 4 configures the pool 20 of SLC blocks from free QLC blocks in array 2, and hybrid mode operation then continues (as previously described).

The above operation continues for the runtime of device 1, with FCP 4 dynamically switching between the hybrid and multibit mode configurations of the array whenever the array capacity-usage traverses the threshold level TH, in accordance with embodiments of the present invention. As explained further below, the threshold TH is defined such that endurance of the array is enhanced by the aforementioned dynamic switching between operating modes. At the end of runtime, FCP 4 stores essential metadata contained in DRAM 7 in non-volatile memory of the device (e.g., in flash array 2), for retrieval on next power-up. The stored metadata may include the current capacity-usage of the array for loading to FCP 4 (from step 10).

Embodiments of the present invention recognize that an appropriate value for the switching threshold TH is dependent on system parameters relating to the particular design and operation of flash memory array 2 in storage device 1. In particular, the choice of threshold depends on a set of system parameters that can include: raw cell endurance in the single-bit and multibit modes; size of the array; workload-type for the array; whether the hybrid mode is static or dynamic (as explained below); and whether write-heat segregation is enabled for operation of the array in the hybrid mode.

Raw cell endurance depends on the memory-cell design (e.g., the particular 3D NAND technology used) and can be specified in terms of raw P/E cycle counts (i.e., the number of P/E cycles which cells can support before degradation or failure occurs). Raw cell endurance may be defined on a block basis (e.g., for flash blocks comprising a specified number of pages/cells). Size of the array may be indicated by the number of chips, packages, etc., of a particular type/capacity (e.g., with a specified number of flash blocks per chip/package), which are used in the array and the amount of capacity which is used for overprovisioning. Array-size parameters may further indicate numbers of SLC/multibit blocks used for hybrid mode operation.

Workload-type may be defined in accordance with various standard definitions (e.g., as random, or Zipfian X/Y (for various values of X/Y, where the skew factor of a Zipfian distribution is chosen such that X percent of the write workload goes to Y percent of the address space), etc.). For hybrid-mode operation of the array, one of a static-hybrid mode (in which the ratio of single-bit and multibit cells is static), and a dynamic-hybrid mode (in which the ratio is dynamically determined) may be specified for the device. Activation/de-activation of write-heat segregation functionality may also be specified. The aforementioned functionality allows the memory controller to identify "hot" and "cold" data and preferentially write/maintain hot data in the SLC pool for faster access, using the multibit pool primarily for cold data.

Figure 4:
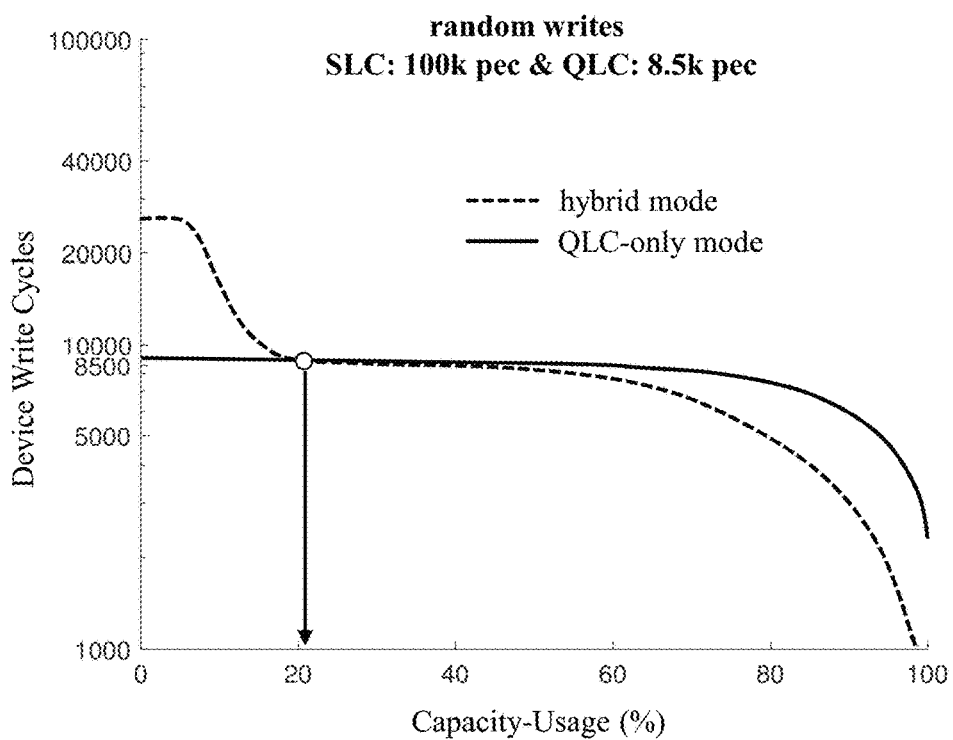
FIG. 4 is an example illustration of endurance versus capacity-usage characteristics of a memory array, in accordance with an embodiment of the present invention.

In an example embodiment, all relevant system parameters may be predetermined for storage device 1. An appropriate switching threshold TH can then be defined for the device based on analysis of array-endurance versus capacity-usage in the hybrid and multibit modes. FIG. 4 is an example illustration of endurance vs. capacity-usage characteristics for an exemplary device (e.g., storage device 1) in the hybrid SLC/QLC and QLC-only modes. The depicted example of FIG. 4 is based on a random write-workload and raw block endurance (P/E cycles (pec)) of 100 k for SLC blocks and 8.5 k for QLC blocks in an exemplary NAND flash device.

FIG. 4 plots array endurance, in terms of device write cycles before failure occurs (e.g. array degradation exceeds a specified limit) against capacity-usage (as defined earlier). Accordingly, FIG. 4 depicts a unique transition point at just over 20% capacity-usage, beyond which the QLC-only mode is beneficial compared to the hybrid SLC/QLC mode. Switching between the hybrid and multibit modes can thus enhance endurance of the array, as a whole. Embodiments of the present invention can provide significant performance improvements over prior hybrid devices in which device endurance is dictated by the pool which wears out first. Wear-imbalance of the pools is likely in practice, and when endurance of one pool is exhausted the remaining endurance of the other pool cannot be exploited.

In the example embodiment described above, the switching threshold TH is defined as the optimal value indicated in FIG. 4 (i.e., the capacity-usage level at which the mode providing better array-endurance transitions between the hybrid and multibit modes). Accordingly, embodiments of the present invention can optimize endurance of flash memory array 2 via the dynamic mode-switching operation.

Various embodiments of the present invention can define the threshold TH as a fixed value, based on known system parameters for the device. FIGS. 5a through 5e depict illustrative examples of how endurance/capacity-usage characteristics vary with different system parameters, in accordance with various embodiments of the present invention.

Figure 5A:
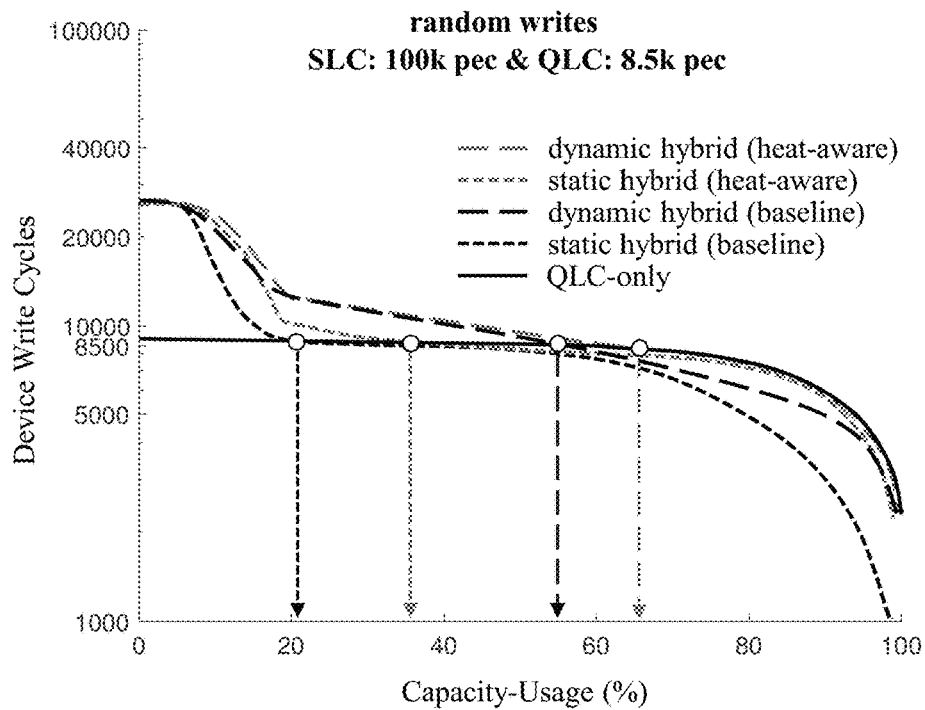
FIG. 5*a*, FIG. 5*b*, FIG. 5*c*, FIG. 5*d*, and FIG. 5*e* are example illustrations of characteristics for memory arrays with various system parameters and different workload types, in accordance with an embodiment of the present invention.

FIG. 5a includes an example depiction of how the characteristics of FIG. 4 are altered with different hybrid mode parameters, in accordance with various embodiments of the present invention. In FIG. 5a, the hybrid-mode curve of FIG. 4 is labelled as "static hybrid (baseline)" corresponding to operation with a static hybrid mode. An alternative hybrid mode is a dynamic, or adaptive, hybrid mode in which the size of the SLC pool is adjusted dynamically during an initial operating phase to adapt the SLC/QLC ratio according to current utilization, workload properties, the current occupied space of each of the SLC and QLC pools, and/or characteristics of the NAND flash memory cells (e.g., the ratio of the average endurance of blocks in SLC-only and QLC-only mode). Once the SLC/QLC ratio has been set, blocks remain statically assigned to their current pools until reevaluation. In one embodiment, blocks then remain statically assigned to their current pools, whereas in other embodiments blocks may switch between pools for wear leveling.

Additional curves in FIG. 5a depict characteristics for: a dynamic hybrid mode ("dynamic hybrid (baseline)"); a static hybrid mode with active write-heat segregation ("static hybrid (heat-aware)"); and a dynamic hybrid mode with active write-heat segregation ("dynamic hybrid (heat-aware)"). In each case, FIG. 5a includes a unique point where the QLC-only mode is beneficial compared to the hybrid SLC/QLC mode. In addition, FIG. 5a indicates the optimal switching thresholds by the corresponding arrows.

Figure 5B:
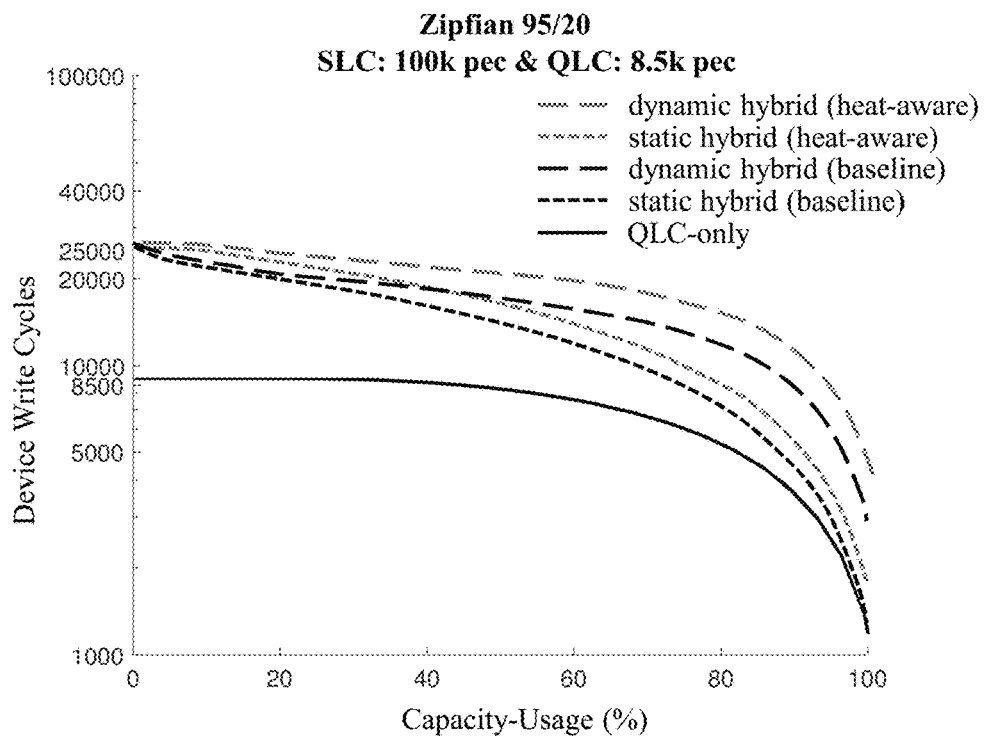
Figure 5C:
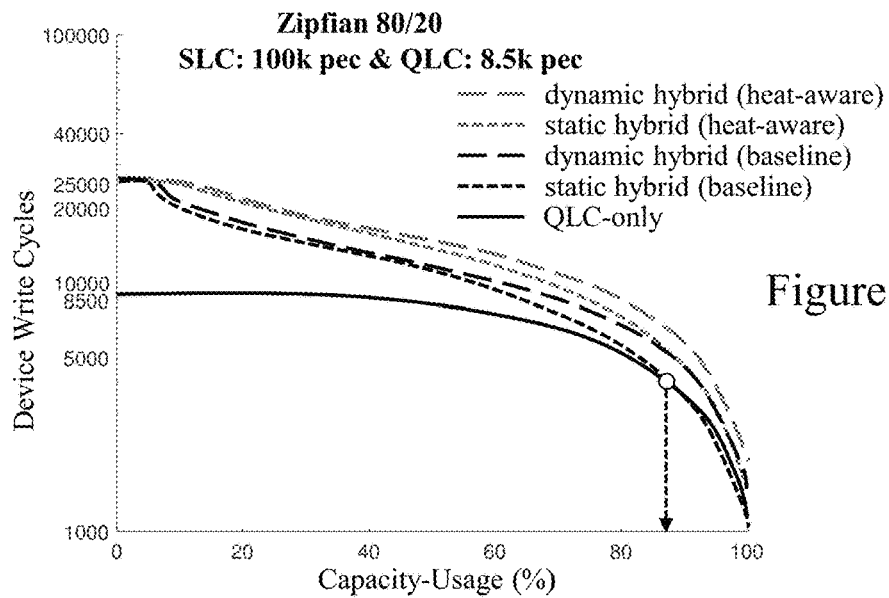
Figure 5D:
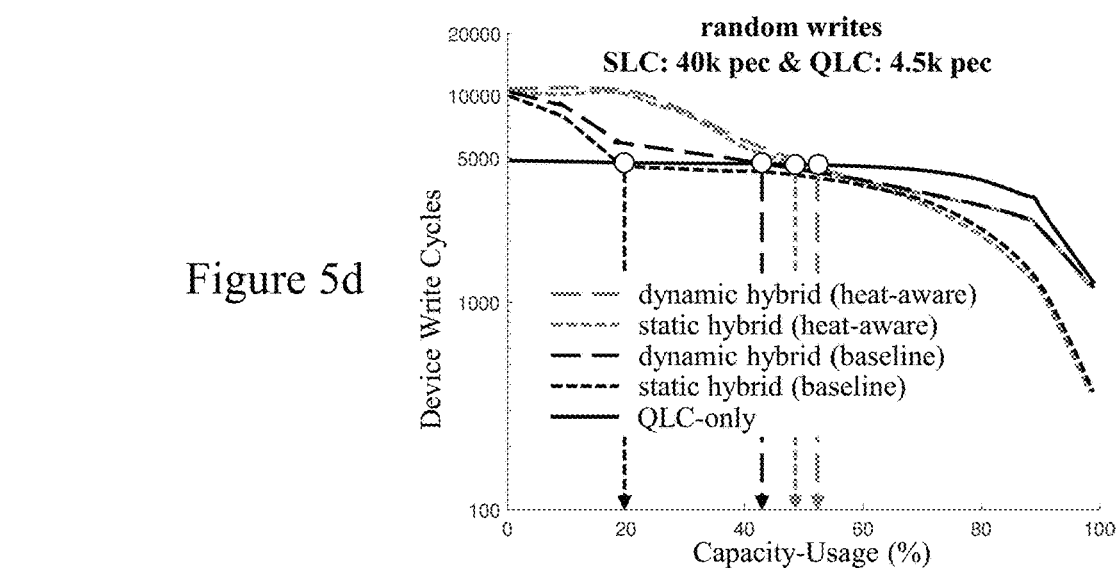
Figure 5E:
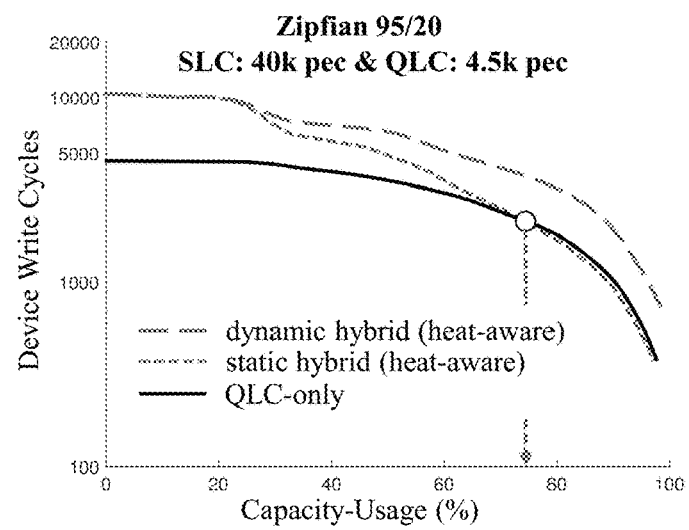

FIG. 5b and FIG. 5c depict equivalent curves for different workload-types. FIG. 5b corresponds to Zipfian 95/20 and FIG. 5c corresponds to Zipfian 80/20. FIG. 5d and FIG. 5e depict additional curves for various modes with raw block endurances of 40 k for SLC blocks and 4.5 k for QLC blocks in an exemplary NAND flash device. Optimal thresholds for switching from hybrid to QLC-only modes are indicated as before. Note that, for some hybrid modes here, hybrid mode endurance surpasses QLC-only endurance at all capacity-usages.

In some storage devices, one or more system parameters may vary over the device lifetime. Workload-type in particular commonly varies during device operation, and this can have a significant effect on optimal switching thresholds, as demonstrated by FIGS. 5a through 5c. In an example embodiment, therefore, the control logic of memory controller 3 is adapted to monitor workload-type during operation of the array and to dynamically define the switching threshold level in dependence on the workload-type.

Figure 6:
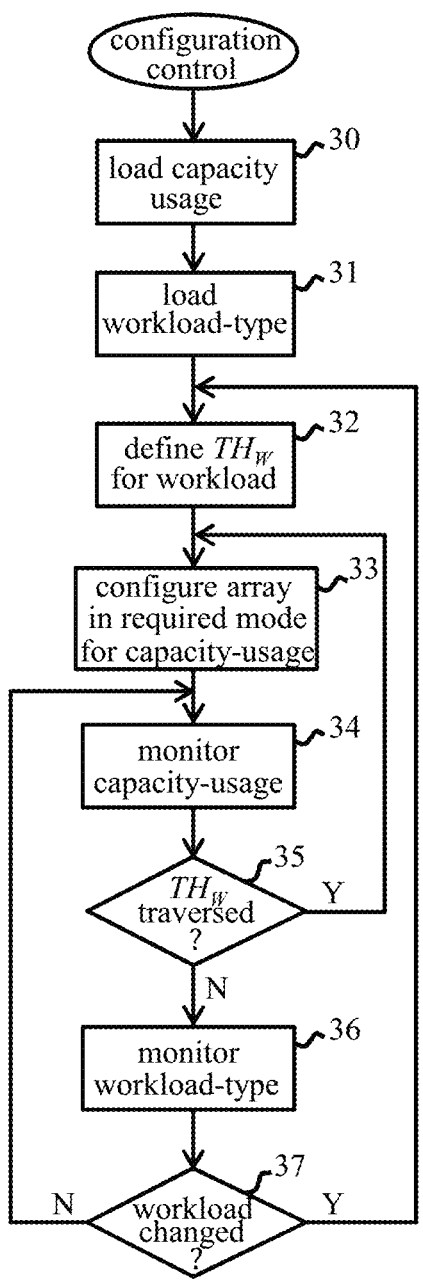
FIG. 6 is a flowchart depicting example steps of a memory control method accommodating different workload types, in accordance with an embodiment of the present invention.

FIG. 6 is a flowchart illustrating a basic operation for the device of FIG. 1, in accordance with embodiments of the present invention. In step 30, FCP 4 loads the current capacity-usage for flash memory array 2 at runtime.

In step 31, FCP 4 determines the current workload-type. In various embodiments, FCP 4 can determine a workload-type in a generally known manner, based on measurements of read/write traffic, by maintaining and leveraging one or more metrics that are sensitive to the user I/O workload. Examples include: so-called write amplification for SLC and QLC tiers; the number of pages invalidated by new writes in the SLC and QLC tiers; the average number of pages found valid per block at garbage collection in the SLC and QLC tiers; and the number of pages assigned a certain heat levels where heat-aware tiering is employed. FCP 4 can determine the current workload-type from metadata (e.g., stored in flash memory array 2 at the end of each runtime). Further, FCP 4 can load the current workload type to DRAM 7 on power-up. If workload is unknown (e.g., on first use of device 1), then FCP 4 can assume a random write-workload.

In step 32, FCP 4 defines a workload-dependent switching threshold THW based on the current workload-type and other known system parameters. In various embodiments, FCP 4 can define the threshold in step 32) using predefined tables or other data structures indicating optimal threshold values for the current device parameters and different workload types. Such tables/structures may be stored in persistent memory of FCP 4 or may be stored in DRAM 7 during runtime and loaded to persistent storage (e.g. array 2) on power-down.

In step 33, FCP 4 configures flash memory array 2 for operation in the hybrid or QLC-only mode based on comparison of current capacity-usage with the threshold THW (generally as described above). FCP 4 can then proceed with array operation in the configured mode with monitoring of capacity-usage (in step 34), and comparison with the threshold THW (in decision step 35). In response to determining that the threshold is traversed (decision step 35, Y branch), operation of FCP 4 reverts to step 33 and FCP 4 reconfigures the array for operation in the other mode. Further, in response to determining that the threshold is not traversed (decision step 35, N branch), operation of FCP 4 proceeds to monitor the workload-type (step 36).

In either mode, FCP 4 continues to monitor workload-type (in step 36). In response to detecting a change in workload-type (decision step 37, Y branch), operation of FCP 4 reverts to step 32 and FCP 4 redefines the threshold THW for the new workload type. Operation then continues as before, with the array being reconfigured in the other mode if necessary, based on threshold comparison of step 32. Further, in response to detecting no change in workload-type (decision step 37, N branch), operation of FCP 4 can then proceed with array operation in the configured mode with monitoring of capacity-usage (in step 34).

Depending on parameters of the device, the hybrid-mode endurance may surpass the multibit-mode endurance at all capacity-usages for certain workload types (e.g., in FIGS. 5b and 5c). If FCP 4 detects such a workload type at step 37, then FCP 4 can define the threshold THW as 100% capacity-usage (in step 32), whereby operation will revert to the hybrid mode (if necessary) and remain in that mode until workload-type changes.

The embodiment depicted and discussed with regard to FIG. 6 allows FCP 4 to adapt to changing workloads in a given device. In example embodiments, FCP 4 can define the switching threshold appropriately to accommodate changes in one or more system parameters. In additional embodiments, FCP 4 can accommodate multiple different parameter sets encompassing all usual ranges and combinations of different parameters for storage device arrays.

Pre-stored tables/data structures can indicate appropriate values for the switching threshold for different parameter sets, including various workload types, based on predetermined characteristics. FCP 4 can then provide a generic memory controller that can adapt to any given array design and operational parameters. In various embodiments, FCP 4 is adapted, prior to operation of array 2, to receive the set of system parameters for the array and to define the switching threshold in dependence on these parameters.

Further, FCP 4 may load system parameters, and select the switching threshold accordingly, on first power-up of a given device, at the start of each runtime, and/or whenever parameters are varied in operation, in accordance with embodiments of the present invention. In particular, in some devices, parameters other than workload may vary during device operation. For example, the hybrid mode may be selectable as dynamic or static for different operating periods. Write-heat segregation may also be selectively activated/deactivated. Size of the active flash memory array 2 may also be selectable in some cases (e.g., from a maximum number of NAND packages available in a device).

Figure 7:
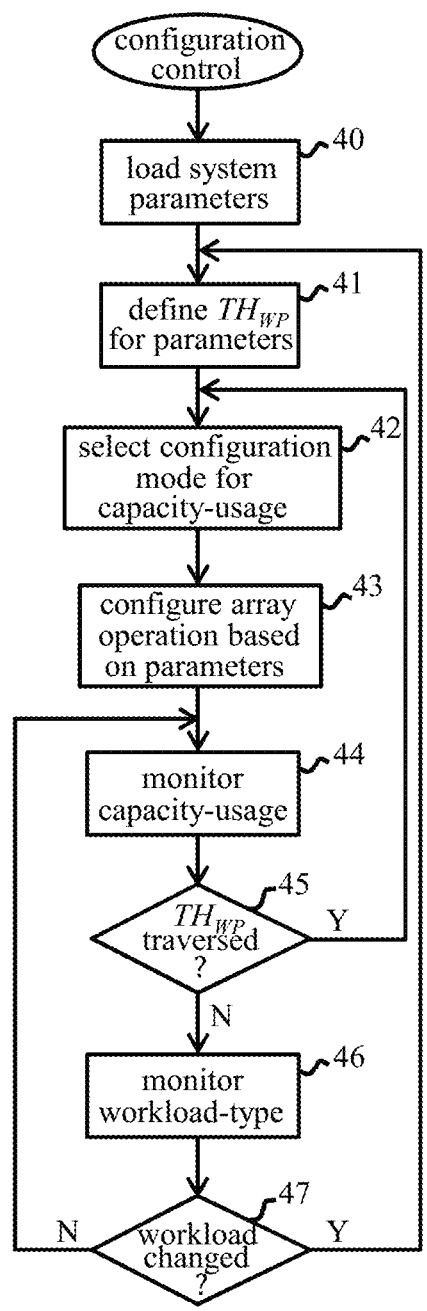
FIG. 7 is a flowchart depicting example steps of a preferred memory control method, in accordance with an embodiment of the present invention.

FIG. 7 is a flowchart illustrating basic operating steps for an embodiment of FCP 4, in accordance with various aspects of the present invention. At step 40, FCP 4 loads the system parameters for the current operating period. The parameter set may indicate current status of any variable parameters (as described above), including current capacity-usage and workload type, along with any "fixed" parameters (e.g., raw pec values for the array cell-types) if not previously loaded to FCP 4.

In step 41, FCP 4 defines a workload-dependent switching threshold THWP for the current parameter set. In step 42, FCP 4 selects either the hybrid-mode or QLC-only array configuration based on comparison of current capacity-usage with the threshold THWP.

In step 43, FCP 4 configures the array for operation in the selected mode and with the specified operational parameters (e.g. dynamic or static hybrid mode, write-heat tiering active/inactive, etc.). System configuration may include data and read path configuration (e.g., queue management in flash I/F 6), size of SLC/QLC pool configuration (e.g., based on active array size), and general flash management or other functionality (e.g., garbage collection, calibration, etc.) dependent on SLC/QLC pool configuration. Device operation then proceeds for this configuration, with FCP 4 controlling operation of the array in accordance with the specified parameters. Remaining steps 44 to 47 of FIG. 7 correspond to steps 34 to 37 of FIG. 6, previously discussed in greater detail above.

It will be appreciated that various changes and modifications can be made to the exemplary embodiments described above. For example, the hybrid/multibit modes may use multibit storage other than QLC storage (e.g., TLC or MLC storage). Memory controllers embodying the invention can be used with non-volatile memory arrays based on cells other than NAND flash cells (e.g., NOR flash cells, PCM (phase-change memory) cells, RRAM (Resistive RAM) cells, NVRAM (Non-Volatile RAM) cells, etc.).

In general, where features are described herein with reference to apparatus embodying the invention, corresponding features may be provided in a method/computer program product embodying the invention, and vice versa.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system for controlling operation of an array of non-volatile memory cells comprising cells which are selectively configurable for single-bit and multibit storage, the computer system comprising:
   one or more computer processors;
   a memory controller;
   one or more computer readable storage media; and
   program instructions stored on the computer readable storage media, the program instructions being executable by a processing device of the memory controller to cause the memory controller to:
   selectively configure the array for operation in a hybrid mode, in which the array comprises both cells configured for single-bit storage and cells configured for multibit storage, and a multibit mode in which all cells in the array are configured for multibit storage;
   dynamically switch between the hybrid mode and multibit mode configurations of array corresponding to the array capacity-usage traversing a defined threshold level associated with enhancing an endurance of the array;
   prior to operation of the array, defining the threshold level in dependence on a set of system parameters for the array, the parameters indicating information selected from the group consisting of:
   raw cell endurance in the single-bit mode and multibit mode;
   size of the array;
   workload-type for the array;
   one of a static-hybrid mode, in which a ratio of single-bit and multibit cells is static, and a dynamic-hybrid mode, in which the ratio is dynamically determined, for operation of the array in the hybrid mode; and
   whether write-heat segregation is enabled for operation of the array in the hybrid mode.

2. The computer system of claim 1, wherein the threshold level is defined as a capacity-usage level to transition between the hybrid mode and multibit mode based on array-endurance.

3. The computer system of claim 1, further comprising program instructions, stored on the computer readable storage media for execution utilizing the memory controller, to:
   monitor workload-type during operation of the array; and
   dynamically define the threshold level in dependence on the workload-type.

4. The computer system of claim 1, further comprising program instructions, stored on the computer readable storage media for execution utilizing the memory controller, to:
   monitor workload-type during operation of the array; and
   dynamically define the threshold level in dependence on the workload-type.

5. The computer system of claim 1, further comprising program instructions, stored on the computer readable storage media for execution utilizing the memory controller, to:
   control operation of the array in accordance with the set of parameters.

6. The computer system of claim 1, further comprising program instructions, stored on the computer readable storage media for execution utilizing the memory controller, to:
   during operation of the array in the hybrid mode, preferentially write data to single-bit cells of the array; and
   move data from single-bit to multibit cells, freeing storage capacity in the single-bit cells.

7. The computer system of claim 1, further comprising:
   a storage device; and
   the storage device comprising an array of non-volatile memory cells, comprising cells which are selectively configurable for single-bit and multibit storage.

8. The computer system of claim 7, wherein the array comprises flash memory cells.

9. The computer system of claim 8, wherein the flash memory cells are selectively configurable for single-bit and 4-bit storage.

10. A method for controlling operation of an array of non-volatile memory cells comprising cells which are selectively configurable for single-bit and multibit storage, the method comprising:
    a memory controller selectively configuring the array for operation in a hybrid mode, in which the array comprises both cells configured for single-bit storage and cells configured for multibit storage, and a multibit mode in which all cells in the array are configured for multibit storage;
    the memory controller dynamically switching between the hybrid mode and multibit mode configurations of array corresponding to the array capacity-usage traversing a defined threshold level associated with enhancing an endurance of the array;
    prior to operation of the array, the memory controller defining the threshold level in dependence on a set of system parameters for the array, the parameters indicating information selected from the group consisting of:
    raw cell endurance in the single-bit mode and multibit mode;
    size of the array;
    workload-type for the array;
    one of a static-hybrid mode, in which a ratio of single-bit and multibit cells is static, and a dynamic-hybrid mode, in which the ratio is dynamically determined, for operation of the array in the hybrid mode; and whether write-heat segregation is enabled for operation of the array in the hybrid mode.

11. The method of claim 10, wherein the threshold level is defined as a capacity-usage level to transition between said the hybrid mode and multibit mode based on array-endurance.

12. The method of claim 10, further comprising:
the memory controller monitoring workload-type during operation of the array; and
the memory controller dynamically defining the threshold level in dependence on the workload-type.

13. The method of claim 10, further comprising:
the memory controller monitoring workload-type during operation of the array; and
the memory controller dynamically defining the threshold level in dependence on the workload-type.

14. A computer program product for controlling operation of an array of non-volatile memory cells comprising cells which are selectively configurable for single-bit and multibit storage, the computer program product comprising a computer readable storage medium having program instructions embodied therein, the program instructions being executable by a processing device of a memory controller to cause the memory controller to:

selectively configure the array for operation in a hybrid mode, in which the array comprises both cells configured for single-bit storage and cells configured for multibit storage, and a multibit mode in which all cells in the array are configured for multibit storage;

dynamically switch between the hybrid mode and multibit mode configurations of array corresponding to the array capacity-usage traversing a defined threshold level associated with enhancing an endurance of the array;

prior to operation of the array, defining the threshold level in dependence on a set of system parameters for the array, the parameters indicating information selected from the group consisting of:

raw cell endurance in the single-bit mode and multibit mode;

size of the array;

workload-type for the array;

one of a static-hybrid mode, in which a ratio of single-bit and multibit cells is static, and a dynamic-hybrid mode, in which the ratio is dynamically determined, for operation of the array in the hybrid mode; and whether write-heat segregation is enabled for operation of the array in the hybrid mode.

* * * * *